(12) United States Patent
Cho et al.

(10) Patent No.: US 11,910,667 B2
(45) Date of Patent: Feb. 20, 2024

(54) DISPLAY APPARATUS AND METHOD OF MANUFACTURING THE SAME

(71) Applicant: Samsung Display Co., Ltd., Yongin-Si (KR)

(72) Inventors: Jaewon Cho, Hwaseong-si (KR); Wonmi Hwang, Seoul (KR); Geurim Lee, Seoul (KR); Changwon Jeong, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 363 days.

(21) Appl. No.: 17/407,399

(22) Filed: Aug. 20, 2021

(65) Prior Publication Data

US 2022/0190091 A1 Jun. 16, 2022

(30) Foreign Application Priority Data

Dec. 14, 2020 (KR) .................. 10-2020-0174355

(51) Int. Cl.
*H10K 59/131* (2023.01)
*H10K 71/00* (2023.01)
*H10K 59/12* (2023.01)

(52) U.S. Cl.
CPC .......... *H10K 59/131* (2023.02); *H10K 71/00* (2023.02); *H10K 59/1201* (2023.02)

(58) Field of Classification Search
None
See application file for complete search history.

(56) References Cited

FOREIGN PATENT DOCUMENTS

| CN | 1637563 A | * | 7/2005 | ....... G02F 1/133555 |
|----|-----------|---|--------|----------------------|
| CN | 114361206 A | * | 4/2022 | .......... H01L 27/124 |
| JP | H11327465 A | * | 5/1998 | |
| KR | 100574367 B1 | | 4/2006 | |
| KR | 1020170051680 A | | 5/2017 | |
| KR | 1020180032249 A | | 3/2018 | |
| KR | 20220062182 A | * | 5/2022 | |
| KR | 20230010157 A | * | 1/2023 | |

* cited by examiner

*Primary Examiner* — Michael Lebentritt
(74) *Attorney, Agent, or Firm* — CANTOR COLBURN LLP

(57) ABSTRACT

A display apparatus includes a substrate including a display area and a peripheral area disposed outside the display area, a transistor disposed in the display area on the substrate, a first pad part disposed in the peripheral area on the substrate, a second pad part disposed in the peripheral area on the substrate and spaced apart from the first pad part, a first pad disposed in the second pad part, a second pad disposed in the second pad part and spaced apart from the first pad and a passivation layer including a plurality of grooves defined between the first pad and the second pad and a protrusion disposed between two adjacent grooves among the grooves.

20 Claims, 12 Drawing Sheets

DISPLAY APPARATUS AND METHOD OF MANUFACTURING THE SAME

This application claims priority to Korean Patent Application No. 10-2020-0174355, filed on Dec. 14, 2020, and all the benefits accruing therefrom under 35 U.S.C. § 119, the content of which in its entirety is herein incorporated by reference.

BACKGROUND

1. Field

Embodiments relate to a display apparatus and a method of manufacturing the display apparatus.

2. Description of the Related Art

The display apparatus is an apparatus that displays an image for providing visual information to a user. Among display apparatuses, an organic light emitting diode display apparatus has recently attracted attention.

The organic light emitting diode display apparatus may include a plurality of pixels including an organic light emitting diode which is a self-light emitting device. The organic light emitting diode may include a pixel electrode, a light emitting layer, and a common electrode. The pixel electrode may include a metal such as silver (Ag), etc., to have a low resistance and a high reflectivity.

SUMMARY

In an organic light emitting diode display apparatus, in an etching process to form a pixel electrode, a metal such as silver (Ag) may not be removed, but may be migrated to a pad part by being reduced to metal particles. The metal particles migrated to the pad part may form a dendrite by generating an electric field due to a voltage difference between pads. In this case, a short circuit may occur between the pads.

Embodiments provide a display apparatus with improved metal particle migration.

Embodiments provide a method of manufacturing a display apparatus to improve metal particle migration.

An embodiment of a display apparatus according to the invention includes a substrate including a display area and a peripheral area disposed outside the display area, a transistor disposed in the display area on the substrate, a first pad part disposed in the peripheral area on the substrate, a second pad part disposed in the peripheral area on the substrate and spaced apart from the first pad part, a first pad disposed in the second pad part, a second pad disposed in the second pad part and spaced apart from the first pad and a passivation layer including a plurality of grooves defined between the first pad and the second pad and a protrusion disposed between two adjacent grooves among the grooves.

In an embodiment, the passivation layer may include an insulation interlayer including an inorganic material and an insulation layer disposed on the insulation interlayer and including an organic material.

In an embodiment, an edge of each of the first pad and the second pad may overlap the insulation layer.

In an embodiment, the protrusion may include at least one selected from an organic material and an inorganic material.

In an embodiment, a lower surface of each of the grooves may be disposed under a lower surface of the first pad and a lower surface of the second pad.

In an embodiment, a width of a lower surface of each of the grooves may be in a range from about 3 micrometers to about 11.5 micrometers.

In an embodiment, an interval between the two adjacent grooves may be in a range from about 3 micrometers to about 20 micrometers.

In an embodiment, the transistor may include a semiconductor layer including a channel region, a source region and a drain region, a gate insulation layer disposed on the semiconductor layer, a gate electrode disposed on the gate insulation layer, an insulation interlayer disposed on the gate electrode, a source electrode disposed on the insulation interlayer and connected to the source region and a drain electrode disposed on the insulation interlayer and connected to the drain region, and the first pad and the second pad may be disposed on the insulation interlayer.

In an embodiment, the first pad and the second pad may include a same material as the source electrode and the drain electrode.

In an embodiment, the first pad part may be connected to a driving chip, and the second pad part may be connected to a flexible circuit board.

In an embodiment, the first pad and the second pad may receive different voltages from each other.

An embodiment of a display apparatus according to the invention includes a substrate including a display area and a peripheral area disposed outside the display area, a pad part disposed in the peripheral area on the substrate and including a first area including an organic material and a second area disposed outside the first area, a wiring part overlapping the second area and including a first wiring and a second wiring and a passivation layer including a plurality of grooves defined between the first wiring and the second wiring and a protrusion disposed between two adjacent grooves among the grooves.

In an embodiment, the passivation layer may include an insulation interlayer disposed under the first wiring and the second wiring.

In an embodiment, the protrusion may include an inorganic material.

In an embodiment, a lower surface of the groove may be disposed under a lower surface of the first wiring and a lower surface of the second wiring.

An embodiment of a method of manufacturing a display apparatus according to the invention includes providing an insulation interlayer on a substrate, where the insulation interlayer includes a first groove and a second groove, providing a first pad and a second pad on the insulation interlayer with the first groove and the second groove disposed therebetween, providing an insulation layer on the first pad and the second pad and forming a third groove overlapping the first groove and a fourth groove overlapping the second groove in the insulation layer.

In an embodiment, the method may further include providing a transistor on the substrate, where the transistor may include a semiconductor layer including a channel region, a source region, and a drain region, a gate insulation layer formed on the semiconductor layer, a gate electrode formed on the gate insulation layer, an insulation interlayer formed on the gate electrode, where a first contact hole may be formed through the insulation interlayer to overlap the source region and a second contact hole may be formed through the insulation interlayer to overlap the drain region, a source electrode formed on the insulation interlayer and connected to the source region, and a drain electrode formed on the insulation interlayer and connected to the drain region, and the source electrode, the drain electrode, the first pad and the second pad may be simultaneously formed with each other.

In an embodiment, a third contact hole may be formed through the insulation layer further to overlap the source electrode or the drain electrode, the first contact hole, the second contact hole, the first groove and the second groove may be simultaneously formed with each other, and the third contact hole, the third groove and the fourth groove may be simultaneously formed with each other.

In an embodiment, the first pad and the second pad may include a same material as the source electrode and the drain electrode.

In an embodiment, an edge of each of the first pad and the second pad may be formed to overlap the insulation layer.

In embodiments of a display apparatus according to the invention, grooves and a protrusion are provided in a portion of a passivation layer disposed between pads, such that a reach distance between the pads may increase. Accordingly, since a migration distance of metal particles between the pads may increase, a migration of the metal particles between the pads may be effectively prevented. Thus, while maintaining a width of a bezel narrow, a short circuit between the pads due to the metal particles may be effectively prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
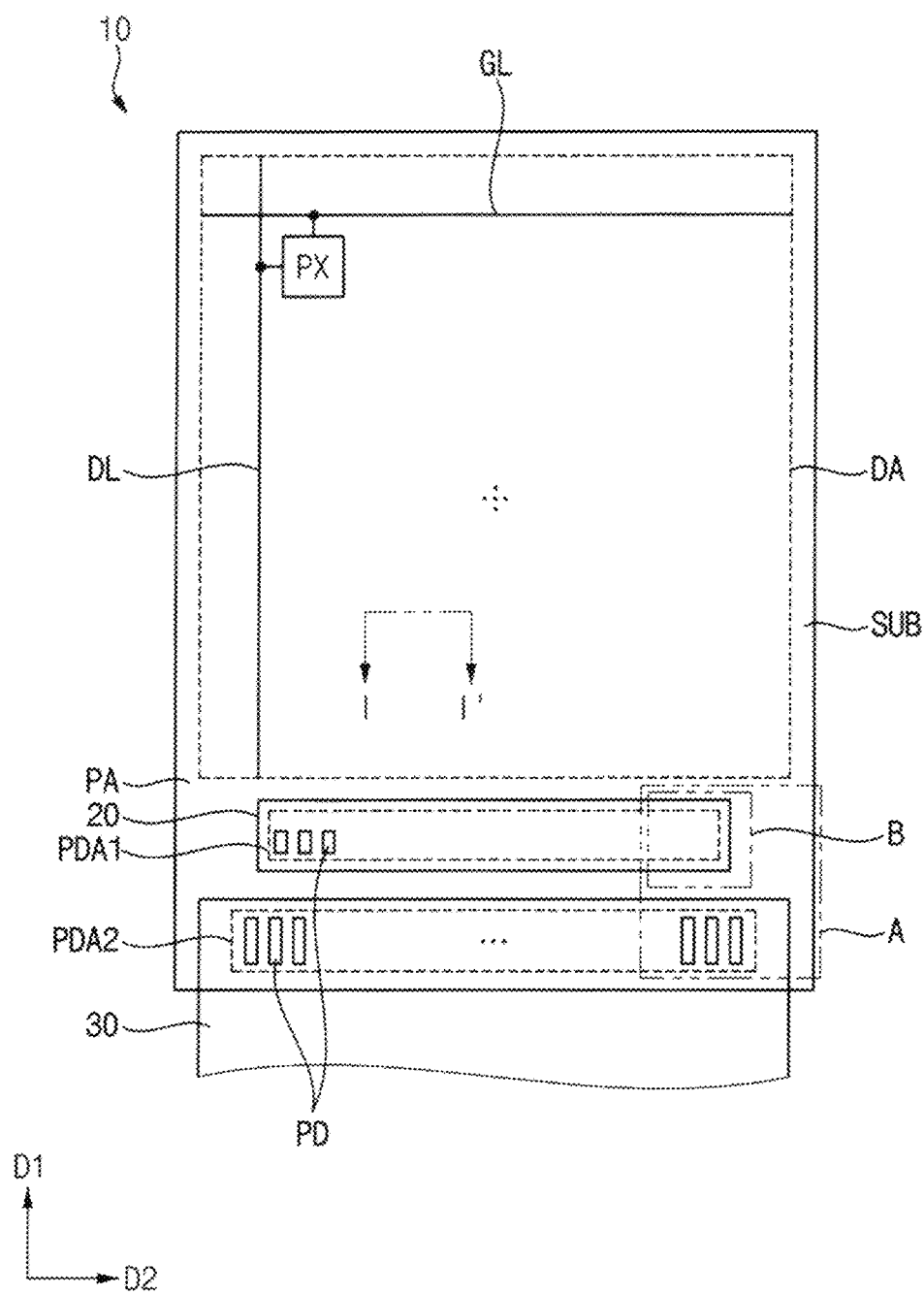
FIG. 1 is a plan view illustrating a display apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings. The same reference numerals are used for the same components in the drawings, and any repetitive detailed descriptions of the same components will be omitted or simplified.

Figure 2:
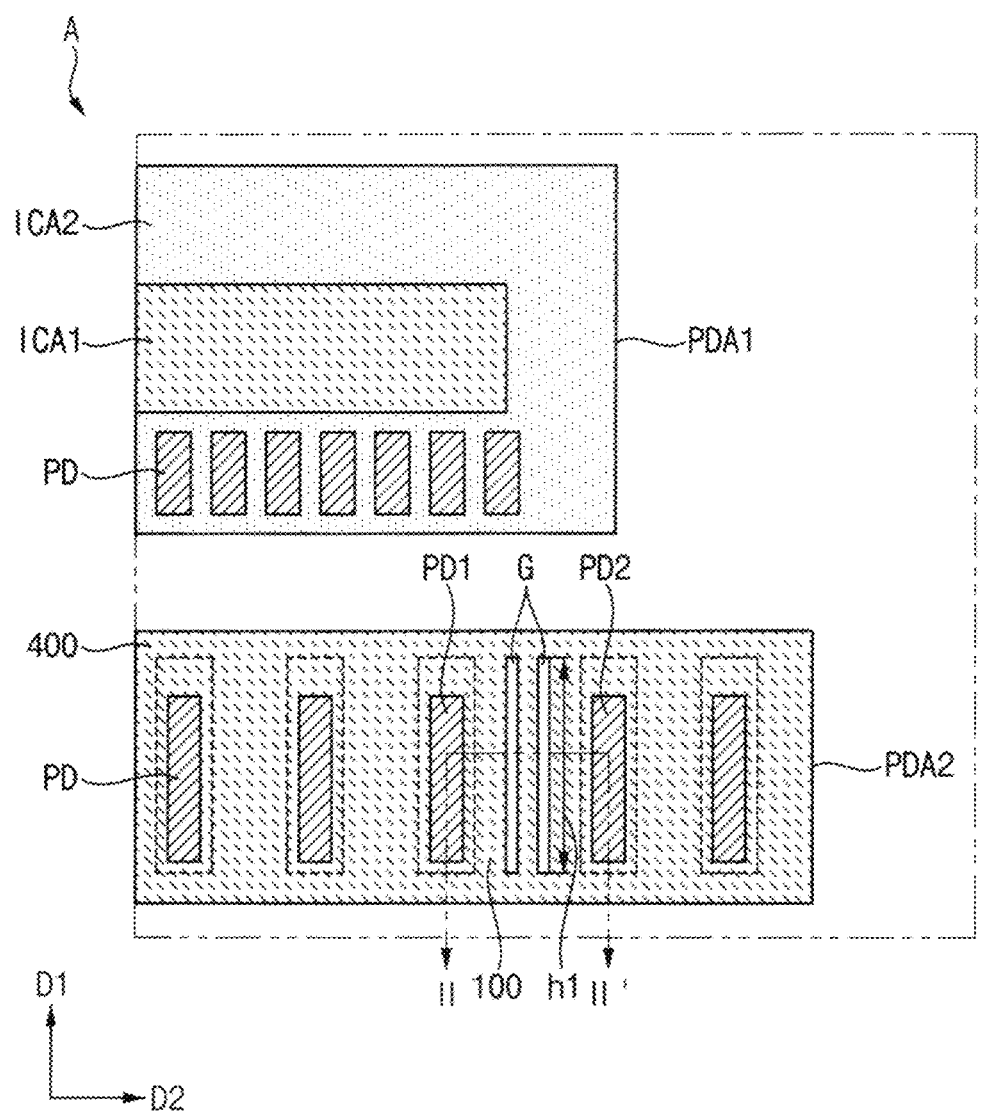
FIG. 2 is an enlarged plan view of an area A of FIG. 1.
Figure 3:
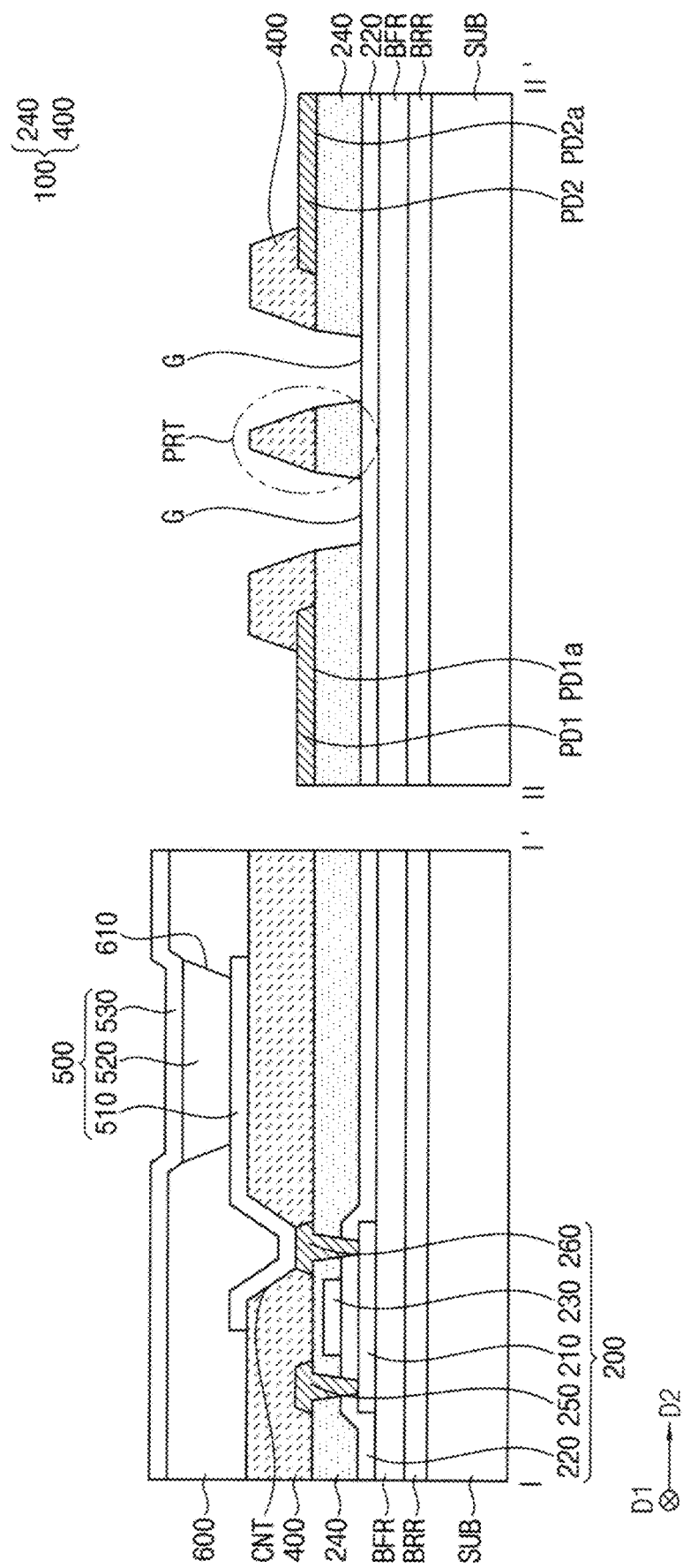
FIG. 3 is a cross-sectional view taken along line I-I' of FIG. 1 and line II-II' of FIG. 2.

FIG. 1 is a plan view illustrating a display apparatus according to an embodiment of the invention. FIG. 2 is an enlarged plan view of an area A of FIG. 1. FIG. 3 is a cross-sectional view taken along line I-I' of FIG. 1 and line II-II' of FIG. 2.

Referring to FIGS. 1 to 3, an embodiment of a display apparatus 10 according to the invention may include a substrate SUB including a display area DA and a peripheral area PA. The display area DA may be an area on which an image is displayed, and the peripheral area PA may be disposed in an edge of the display area DA.

A pixel structure PX and a data line DL and a gate line GL connected to the pixel structure PX may be disposed in the display area DA. The pixel structure PX may include a transistor 200 and a light emitting diode 500. The data line DL may be electrically connected to a data driver and may extend along a first direction D1. The gate line GL may be connected to the gate driver and may extend along a second direction D2 crossing the first direction D1.

In an embodiment, wirings, pads PD, and a driving circuit for transmitting an electrical signal to the display area DA may be disposed in the peripheral area PA. The pads PD may receive an external signal for emitting light from the light emitting diode 500 and transmit the signal to the light emitting diode 500.

A first pad part PDA1 and a second pad part PDA2 may be disposed in the peripheral area PA. The first pad part PDA1 and the second pad part PDA2 may be disposed to be spaced apart from each other. The first pad part PDA1 may be disposed between the display area DA and the second pad part PDA2.

A driving chip 20 may be connected to the first pad part PDA1, and a flexible circuit board 30 may be connected to the second pad part PDA2. The driving chip 20 may be an integrated circuit ("IC") chip such as a driving IC. The driving chip 20 may be mounted in a chip-on-glass ("COG") manner in the peripheral area PA to be electrically connected to the plurality of pads PD. However, embodiments of the invention are not limited thereto, and alternatively, the driving chip 20 may be mounted in the flexible circuit board 30 in a chip-on-film ("COF") manner.

The flexible circuit board 30 may be a circuit board for supplying a driving signal to the display apparatus 10. The flexible circuit board 30 may include a timing controller and a power voltage generator. The timing controller may generate a control signal driving the display apparatus 10. The power voltage generator may generate a power voltage.

Each of the driving chip 20 and the flexible circuit board 30 may include electrodes. The electrodes of the driving chip 20 may be connected to the pads PD of the first pad part PDA1. A light emission of the light emitting diode 500 may be controlled by the driving chip 20 connected to the first pad part PDA1. The electrodes of the flexible circuit board 30 may be connected to the pads PD of the second pad part PDA2. The flexible circuit board 30 may supply the driving signal to the display apparatus 10 through the second pad part PDA2 connected thereto.

Each of the first pad part PDA1 and the second pad part PDA2 may be connected to a wiring part. The wiring part may include wirings connecting the first pad part PDA1 and the second pad part PDA2 to each other. The wiring part may receive a signal from the second pad part PDA2 and transmit the signal to the first pad part PDA1. In such an embodiment, the driving signal may be supplied to the display apparatus 10 through the flexible circuit board 30, the second pad part PDA2, the wiring part and the first pad part PDA1.

The display area DA may display an image based on a driving signal applied to the pixel structures PX disposed on the substrate SUB. The pixel structures PX may be arranged in a matrix form along the first direction D1 and the second direction D2 orthogonal to the first direction D1.

In an embodiment, as shown in FIG. 3, the display apparatus 10 may include the substrate SUB, a barrier layer BRR, a buffer layer BFR, a transistor 200, an insulation interlayer 240, an insulation layer 400, a pixel defining layer 600, and the light emitting diode 500.

The substrate SUB may include at least one selected from various materials. In one embodiment, for example, the substrate SUB may include or be formed of a transparent glass material containing $SiO_2$ as a main component. However, the substrate SUB may not be limited thereto, and may include or be formed of a transparent plastic material. The plastic material may include at least one organic material selected from insulating organic materials such as polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide, polycarbonate ("PC"), cellulose triacetate ("TAC") and cellulose acetate propionate ("CAP").

The barrier layer BRR may be disposed on the substrate SUB. The barrier layer BRR may prevent external foreign substances from penetrating into the display apparatus 10 through the substrate SUB. The barrier layer BRR may have a single layer structure or a multilayer structure including an inorganic material such as silicon nitride (SiNx) and/or silicon oxide (SiOx).

The buffer layer BFR may be disposed on the barrier layer BRR. The buffer layer BFR may provide a flat surface on the substrate SUB or prevent impurities from being diffused.

The transistor 200 may be disposed on the buffer layer BFR. The transistor 200 may include a semiconductor layer 210, a gate insulation layer 220, a gate electrode 230, a source electrode 250, and a drain electrode 260. The semiconductor layer 210 may include polycrystalline silicon, an amorphous silicon, or an oxide semiconductor.

The gate insulation layer 220 may be disposed on the semiconductor layer 210. The gate electrode 230 may be disposed on the gate insulation layer 220. The gate electrode 230 may be insulated from the semiconductor layer 210 by the gate insulation layer 220. The gate insulation layer 220 may overlap or cover an entire surface of the substrate SUB. The gate insulation layer 220 may include an inorganic insulating material such as silicon oxide (SiOx) or silicon nitride (SiNx).

An insulation interlayer 240 may be disposed on the gate electrode 230. The insulation interlayer 240 may include an inorganic material. A source electrode 250 and a drain electrode 260 of the transistor 200, a data line, a signal line, etc., may be disposed on the insulation interlayer 240. Each of the source electrode 250 and the drain electrode 260 may contact a region of the semiconductor layer 210 through openings defined through the insulation interlayer 240 and may be electrically connected to the semiconductor layer 210. In one embodiment, for example, the source electrode 250 and the drain electrode 260 may contact a source region and a drain region of the semiconductor layer 210, respectively.

The insulation layer 400 may be disposed on the insulation interlayer 240. The insulation layer 400 may compensate and flatten a step structure therebelow to increase a light emission efficiency of the light emitting layer 520. The insulation layer 400 may overlap the transistor 200 and cover the transistor 200. The insulation layer 400 may include an organic material, for example. The organic material may include polyimide, polyamide, polyacrylate, unsaturated polyester, epoxy resin, phenol resin, etc., but is not limited thereto.

In an embodiment, a contact hole CNT is defined through the insulation layer 400. The contact hole CNT may mean or be defined by a removed portion of the insulation layer 400. A pixel electrode 510 may be disposed on the insulation layer 400. The pixel electrode 510 may overlap the contact hole CNT. The pixel electrode 510 may be formed through a patterning process after a material for forming the pixel electrode 510 is applied to the display area DA and the peripheral area PA. The pixel electrode 510 may include a reflective conductive material, a semi-transparent conductive material, or a transparent conductive material. In one embodiment, for example, the pixel electrode 510 may include at least one selected from metals and transparent conductive materials such as indium tin oxide ("ITO") and indium zinc oxide ("IZO"), lithium (Li), calcium (Ca), aluminum (Al), silver (Ag), magnesium (Mg) and gold (Au).

In a process of forming the pixel electrode 510, metal particles for forming the pixel electrode 510 may remain in the first pad part PDA1 and the second pad part PDA2 disposed in the peripheral area PA. When the metal particles remain in the first pad part PDA1 and the second pad part PDA2 disposed in the peripheral area PA, the metal particles may migrate due to a voltage difference between the pads PD1 and PD2. Accordingly, a short circuit between the pads PD1 and PD2 may occur. In an embodiment, the short circuit between the pads PD1 and PD2 may be effectively prevented by increasing the reach distance between the pads PD1 and PD2.

The pixel defining layer 600 may be disposed on the pixel electrode 510. An opening portion 610 may be defined through the pixel defining layer 600 to overlap the pixel electrode 510. The light emitting layer 520 may be disposed in the opening portion 610. A common electrode 530 for transmitting a common voltage may be disposed on the light emitting layer 520. The common electrode 530 may include a transparent conductive material such as ITO and IZO. The common electrode 530 may be formed to have a light transmittance by stacking metals such as calcium (Ca), barium (Ba), magnesium (Mg), aluminum (Al), or silver (Ag).

The pixel electrode 510, the light emitting layer 520, and the common electrode 530 may compose or collectively define the light emitting diode 500. In an embodiment, the pixel electrode 510 may be an anode, which is a hole injection electrode, and the common electrode 530 may be a cathode, which is an electron injection electrode. Alternatively, the pixel electrode 510 may be the cathode, and the common electrode 530 may be the anode.

In an embodiment, the second pad PDA2 may include a first pad PD1 and a second pad PD2. The first pad PD1 and the second pad PD2 may be spaced apart from each other. The passivation layer 100 may be disposed between the first pad PD1 and the second pad PD2. The passivation layer 100 may include an insulation interlayer 240 and an insulation layer (e.g., an insulating film) 400. In such an embodiment, the passivation layer 100 may be defined by the insulation interlayer 240 and the insulation layer 400 disposed between the first pad PD1 and the second pad PD2. However, the invention is not limited thereto, and the passivation layer 100 may further include the gate insulation layer 220.

Both of the first pad PD1 and the second pad PD2 may entirely overlap the insulation interlayer 240. Each edge of the first and second pads PD1 and PD2 may overlap the insulation layer 400. The first pad PD1 and the second pad PD2 may be insulated from each other since each edge of the first pad PD1 and the second pad PD2 overlaps the insulation layer 400. Accordingly, the short circuit between the first pad PD1 and the second pad PD2 may be prevented.

In an embodiment, the first pad PD1 and the second pad PD2 may be formed using a same material as the source electrode 250 and the drain electrode 260. The first pad PD1 and the second pad PD2 may be disposed in or directly on a same layer as the source electrode 250 and the electrode 260. Therefore, the first pad PD1 and the second pad PD2 may include a conductive material such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), etc. In an embodiment, as shown in FIG. 3, the first pad PD1 and the second pad PD2 may have a single layer structure, but not being limited thereto. In an alternative embodiment, the first pad PD1 and the second pad PD2 may be a multi-layer structure. In one embodiment, for example, the first pad PD1 and the second pad PD2 may have a form in which a first conductive layer and a second conductive layer are stacked one on another. The first conductive layer may have a same layer structure as the gate electrode 230, and the second conductive layer may have a same layer structure as the source electrode 250 and the drain electrode 260.

The first pad PD1 and the second pad PD2 may transmit different signals from each other. Accordingly, the first pad PD1 and the second pad PD2 may receive different voltages each other. An electric field may be generated due to a voltage difference between the first pad PD1 and the second pad PD2. However, electricity between the first pad PD1 and the second pad PD2 may be effectively prevented by the protrusion PRT and grooves G included in the passivation layer 100.

The insulation interlayer 240 may be disposed on the gate electrode 230. The insulation interlayer 240 may include an inorganic material. A source electrode 250 and a drain electrode 260 of the transistor 200, the first pad PD1, and the second pad PD2 may be disposed on the insulation interlayer 240. Each of the source electrode 250 and the drain electrode 260 may contact a region of the semiconductor layer 210 through the contact holes of the insulation interlayer 240. The source electrode 250 and the drain electrode 260 may be electrically connected to the semiconductor layer 210. In one embodiment, for example, each of the source electrode 250 and the drain electrode 260 may be connected to a source region and a drain region of the semiconductor layer 210.

The insulation layer 400 may be disposed on the insulation interlayer 240. The insulation layer 400 may compensate and flatten a step structure therebelow to increase a light emission efficiency of the light emitting layer 520. The insulation layer 400 may overlap the transistor 200 and cover the transistor 200. The insulation layer 400 may include an organic material. The organic material may include polyimide, polyamide, polyacrylate, unsaturated polyester, epoxy resin, phenol resin, etc., but is not limited thereto.

Figure 4:
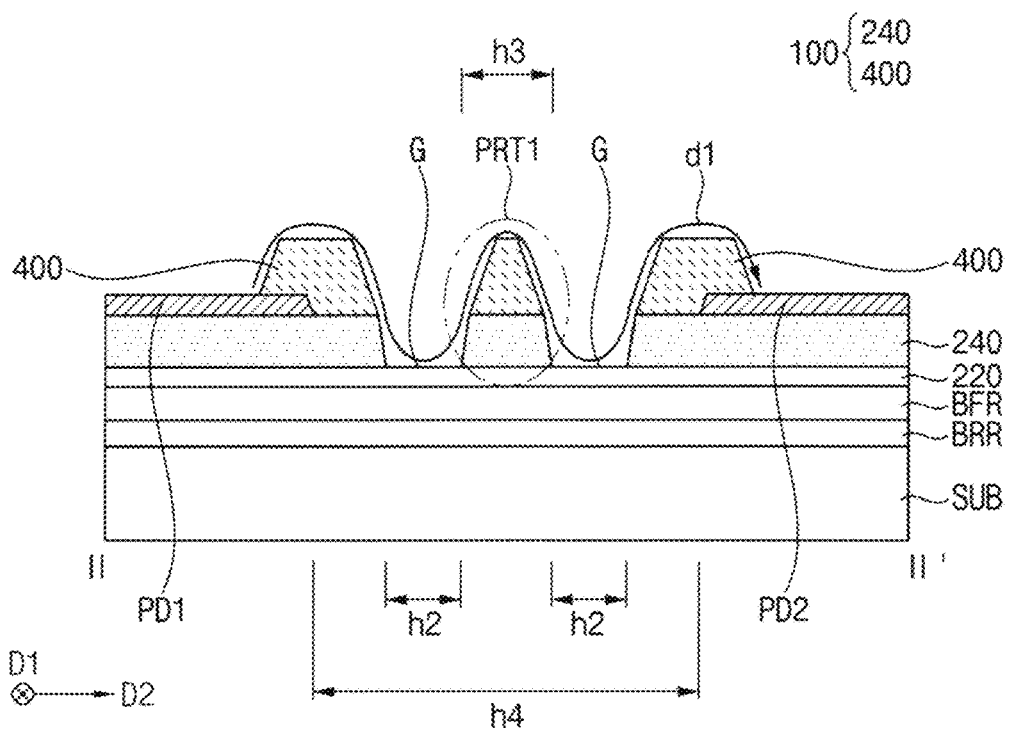
FIG. 4 is a cross-sectional view illustrating an embodiments of a passivation layer of FIG. 3.

FIG. 4 is a cross-sectional view illustrating an embodiment of a passivation layer of FIG. 3.

Referring to FIGS. 2 to 4, in an embodiment, the passivation layer 100 may include at least two grooves G and at least one protrusion PRT1 disposed between the grooves G. However, embodiments of the invention are not limited thereto, and alternatively, three or more grooves and two or more protrusions may be included or defined in the passivation layer 100.

In an embodiment where the passivation layer 100 disposed between the first pad PD1 and the second pad PD2 includes two grooves G and one protrusion PRT1, the reach distance d1 from the first pad PD1 to the second pad PD2 may increase. That is, an embodiment of the display apparatus 10 according to the invention including the passivation layer 100 with the grooves G and the protrusion PRT1 as described above may have a greater reach distance d1 than a conventional display apparatus without the grooves G and the protrusion PRT1. The reach distance d1 may mean or be defined by a distance reaching from an upper surface of the first pad PD1 to an upper surface of the second pad PD2 along an upper surface of the passivation layer 100. When the reach distance d1 is large, a migration distance of the metal particles may increase, and thus a migration of the metal particles may be limited. Accordingly, the metal particles existing on the first pad PD1 and the second pad PD2 may be effectively prevented from forming dendrites. Accordingly, the short circuit occurring between the first pad PD1 and the second pad PD2 may be prevented.

In such an embodiment, the reach distance d1 from the grooves G to the protrusion PRT1 may be increased without increasing the distance between the first pad PD1 and the second pad PD2, such that a width of a bezel may be allowed to be narrow.

Each of the grooves G may mean or defined by a portion in which the insulation interlayer 240 and the insulation layer 400 is removed. A lower surface of each of the grooves G may mean or defined by a portion in which the insulation interlayer 240 and the insulation layer 400 are removed. In an alternative embodiment, each of the grooves G may mean or defined by a portion in which only the insulation layer 400 is removed. In another alternative embodiment, each of the grooves G may mean a portion in which a portion of the insulation layer 400 and the insulation interlayer 240 is partially removed. When the grooves G are formed through both the insulation interlayer 240 and the insulation layer 400, the reach distance d1 may be the greatest.

In an embodiment, as show in FIG. 2, a length h1 of each of the grooves G in the first direction D1 may be equal to or greater than a length of each of the first pad PD1 and the second pad PD2 in the first direction D1.

In an embodiment, the bottom surface of each of the grooves G may be disposed below a lower surface PD1a of the first pad PD1 and a lower surface PD2a of the second pad PD2. In such an embodiment, since the grooves G are portions in which the insulation layer 400 and the insulation interlayer 240 is removed, the lower surface of the grooves G may be disposed in a lower level than the lower surface PD1a of the first pad PD1 and the lower surface PD2a of the second pad PD2. In such an embodiment, the reach distance d1 may be greater than a case where the lower surface of each of the grooves G is disposed in a higher level than the lower surface PD1a of the first pad PD1 and the lower surface PD2a of the second pad PD2. Accordingly, in such an embodiment, the short circuit between the first pad PD1 and the second pad PD2 may be effectively prevented.

In an embodiment, a width h2 of the lower surface of each of the grooves G in the second direction D2 may be in a range from about 3 micrometers to about 11.5 micrometers. If the width h2 of the lower surface of each of the grooves G is about 3 micrometers or less, a mask used to form the grooves G may be difficult to form the grooves G. That is, when the width h2 of the lower surface of each of the grooves G is about 3 micrometers or less, the passivation layer 100 adjacent to the grooves G may be merged with each other when the display apparatus 10 is manufactured. If the width h2 of the bottom of each of the grooves G is about 11.5 micrometers or greater, the protrusion PRT1 may be difficult to be formed between the grooves G because an interval h3 between the grooves G may be too narrow due to the wide width h2 of the lower surface of each of the grooves G. That is, as the width h2 of the lower surface of each of the grooves G is wider, a width h3 of the protrusion PRT1 is narrower, so when the width h2 of the lower surface of each of the grooves G is about 11.5 micrometers or greater, the protrusion PRT1 may not be effectively formed. However, the widths of the grooves G may not be the same as each other, and the widths of the grooves G may be different from each other. In one embodiment, for example, the width h2 of the lower surface of each of grooves G may be about 8 micrometers.

In an embodiment, the interval h3 between the grooves G in the second direction D2 may be in a range from about 3 micrometers to about 20 micrometers. In such an embodiment, since the interval h3 between the grooves G is the same as the width h3 of the lower surface of the protrusion PRT1, the width h3 of the lower surface of the protrusion PRT1 may be in a range from about 3 micrometers to about 20 micrometers. If the interval h3 between the grooves G is about 3 micrometers or less, forming the protrusion PRT1 in a manufacturing process may be difficult. If the interval h3 between the grooves G is about 20 micrometers or greater, the width h2 of the lower surface of each of the grooves G may become narrower, and thus forming the grooves may be difficult. In one embodiment, for example, the interval h3 between the grooves G may be about 10 micrometers.

In an embodiment, an interval h4 between the first pad PD1 and the second pad PD2 in the second direction D2 may be in a range from about 30 micrometers to about 50 micrometers. IF the interval h4 between the first pad PD1 and the second pad PD2 is about 30 micrometers or less, providing the grooves G and the protrusion PRT1 between the first pad PD1 and the second pad PD2 in the manufacturing process may be difficult. In addition, the short circuit between the first pad PD1 and the second pad PD2 may be easy to occur. If the interval h4 between the first pad PD1 and the second pad PD2 is about 50 micrometers or greater, an area of the second pad part PDA2 may become substantially great, so that the width of the bezel may become undesirably wide. In one embodiment, for example, the interval h4 between the first pad PD1 and the second pad PD2 may be about 40 micrometers.

The protrusion PRT1 may be defined by portions of an insulation interlayer 240 and an insulation layer 400. That is, the protrusion PRT1 may mean a portion disposed between the grooves G among the remaining portions of passivation layer 100 after the grooves G are formed by removing corresponding portions of the passivation layer 100. In such an embodiment since the protrusion PRT1 includes both the insulation interlayer 240 and the insulation layer 400, the protrusion PRT may include both an inorganic material and an organic material. In such an embodiment where the protrusion PRT1 includes both the insulation interlayer 240 and the insulation layer 400, the reach distance d1 may be the greatest. Therefore, the migration of the metal particles may be limited. In such an embodiment, the short circuit between the first pad PD1 and the second pad PD2 may be effectively prevented while maintaining the width of the bezel narrow.

Figure 5:
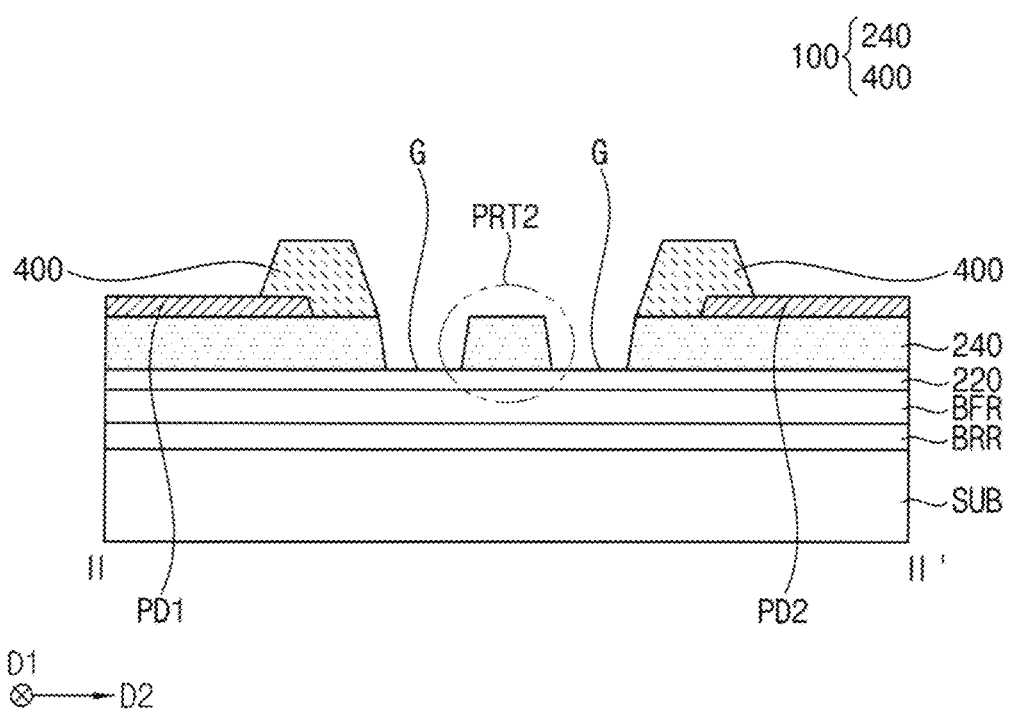
FIGS. 5 and 6. are cross-sectional view illustrating embodiments of the passivation layer of FIG. 3.
Figure 6:
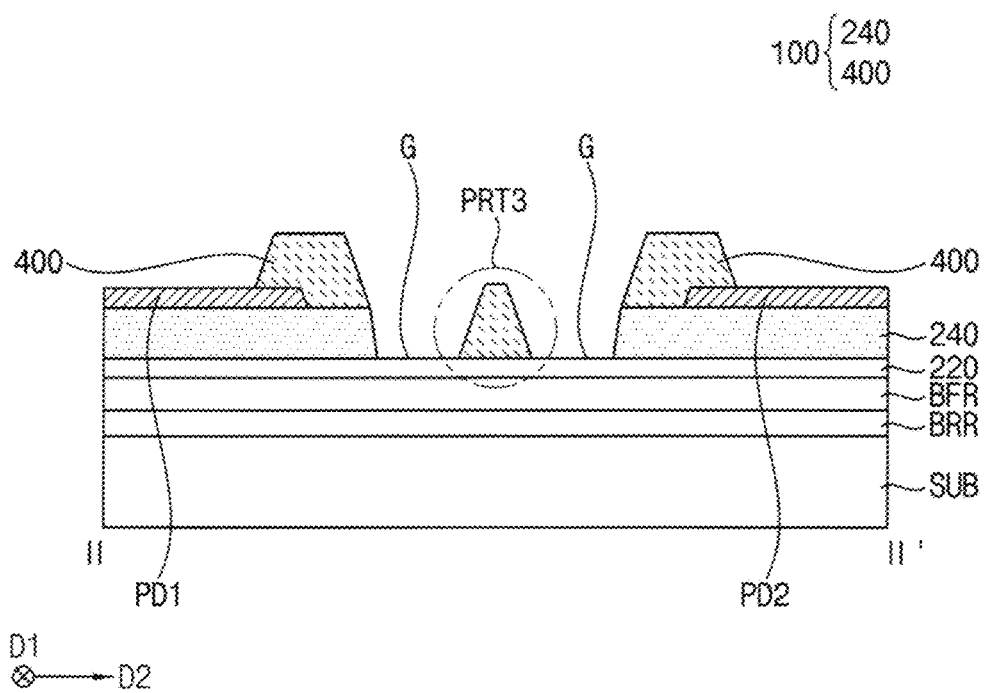

FIGS. 5 and 6. are cross-sectional view illustrating embodiments of the passivation layer of FIG. 3.

Referring to FIG. 5, in an embodiment, a protrusion PRT2 may include or be defined by the insulation interlayer 240. In such an embodiment, as shown in FIG. 5, the protrusion PRT2 may have a form in which the insulation layer 400 is removed from the protrusion PRT1 of FIG. 4. In a manufacturing process, the insulation layer 400 disposed in the region in which the protrusion PRT2 is disposed may be removed. In such an embodiment, since the protrusion PRT2 includes only the insulation interlayer 240, the protrusion PRT2 may include an inorganic material. Since the reach distance increases due to the protrusion PRT2, the short circuit between the first pad PD1 and the second pad PD2 may be effectively prevented.

Referring to FIG. 6, in an alternative embodiment, a protrusion PRT3 may include or be defined by the insulation layer 400. In such an embodiment, as shown in FIG. 6, the protrusion PRT3 may have a form in which the insulation interlayer 240 is removed from the protrusion PRT1 of FIG. 4. In a manufacturing process, the insulation interlayer 240 disposed in the region in which the protrusion PRT3 is disposed may be removed, and the insulation layer 400 may be formed thereon. In such an embodiment, since the protrusion PRT3 includes only the insulation layer 400, the protrusion PRT3 may include an organic material. In such an embodiment, since the reach distance increases due to the protrusion PRT3, the short circuit between the first pad PD1 and the second pad PD2 may be effectively prevented.

Figure 7:
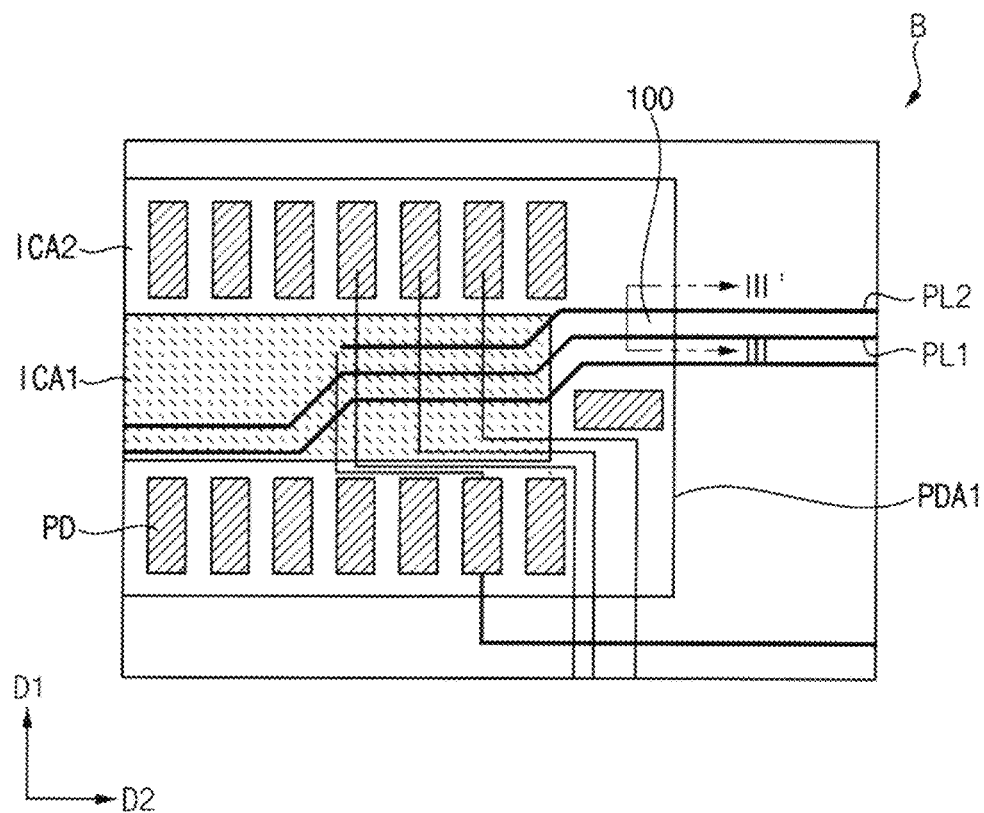
FIG. 7 is an enlarged plan view of an area B of FIG. 1.
Figure 8:
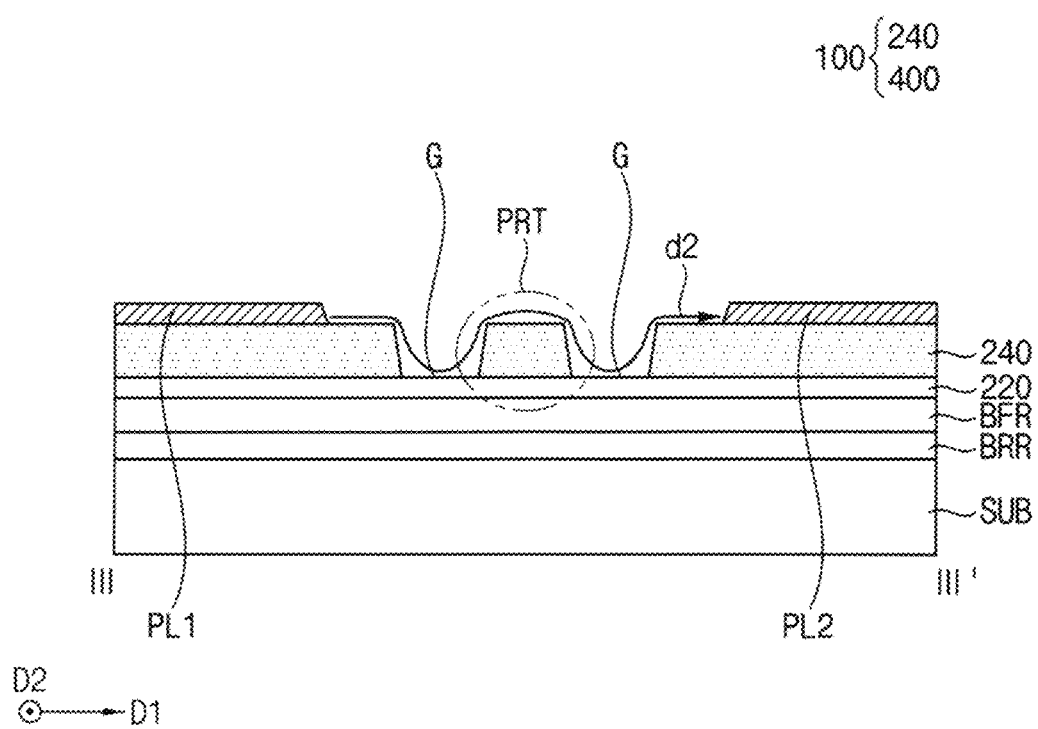
FIG. 8 is a cross-sectional view taken along line III-III' of FIG. 7.

FIG. 7 is an enlarged plan view of an area B of FIG. 1. FIG. 8 is a cross-sectional view taken along line III-III' of FIG. 7.

Referring to FIGS. 1 and 7, in an embodiment, the first pad part PDA1 may be disposed in the peripheral area PA on the substrate SUB. The first pad part PDA1 may include a first area ICA1 disposed in a center and a second region ICA2 disposed in an edge of the first area ICA1. The plurality of pads PD may be disposed in the second area ICA2. The first pad part PDA1 may be a part connected to the driving chip 20. In such an embodiment, when connecting the first pad part PDA1 and the driving chip 20, the pad PD of the second region ICA2 and the electrode of the driving chip 20 may contact each other. An electrical signals may be transmitted from the driving chip 20 to the second area ICA2 through the pad PD of the second area ICA2 and the electrode of the driving chip 20.

In an embodiment, the first area ICA1 may include both the insulation interlayer 240 and the insulation layer 400 of FIG. 3. In such an embodiment, the first area ICA1 may include an organic material and an inorganic material. The second area ICA2 may include an insulation interlayer 240. Therefore, the second area ICA2 may include an inorganic material.

The first area ICA1 and the second region ICA2 may overlap a wiring part including the wirings PL1 and PL2. The wiring part may connect the first pad part PDA1 and components of the display apparatus 10 to each other. The wiring part may include a first wiring PL1 and a second wiring PL2. The first wiring PL1 and the second wiring PL2 may be spaced apart from each other. In an embodiment, as shown in FIG. 8, the passivation layer 100 may be disposed between the first wiring PL1 and the second wiring PL2. The passivation layer 100 may include an insulation interlayer 240. In such an embodiment, the passivation layer 100 may mean or be defined by a portion of the insulation interlayer 240 disposed between the first wiring PL1 and the second wiring PL2. However, the invention is not limited thereto, and alternatively, the passivation layer 100 may further include the gate insulation layer 220.

The first wiring PL1 and the second wiring PL2 may be formed using a same material as the source electrode and the drain electrode. The first wiring PL1 and the second wiring PL2 may be disposed in or directly on a same layer as the source electrode and the drain electrode. Therefore, the first wiring PL1 and the second wiring PL2 may include a conductive material such as copper (Cu), aluminum (Al), silver (Ag), molybdenum (Mo), chromium (Cr), gold (Au), platinum (Pt), palladium (Pd), tantalum (Ta), tungsten (W), titanium (Ti), and nickel (Ni).

The first wiring PL1 and the second wiring PL2 may transmit different signals from each other. Therefore, the first wiring PL1 and the second wiring PL2 may receive different voltages from each other. An electric field may be generated due to a voltage difference between the first wiring PL1 and the second wiring PL2. In such an embodiment, an electricity between the first wiring PL1 and the second wiring PL2 may be effectively prevented by the protrusion PRT and the grooves G.

Referring to FIGS. 3 and 8, the insulation interlayer 240 may be disposed on the gate insulation layer 220. The insulation interlayer 240 may include an inorganic material. The source electrode 250 and the drain electrode 260 of the transistor 200, the first wiring PL1 and the second wiring PL2 may be disposed on the insulation interlayer 240.

The passivation layer 100 may include at least two grooves G and at least one protrusion PRT disposed between the grooves G. However, embodiments of the invention are not limited thereto, and alternatively, the passivation layer 100 may include three or more grooves and two or more protrusions.

In an embodiment where the protective layer 100 disposed between the first wiring PL1 and the second wiring PL2 includes two grooves G and one protrusion PRT, the reach distance d1 from the first wiring PL1 to the second wiring PL2 may increase. That is, an embodiment of the display apparatus 10 according to the invention having the grooves G and the protrusion PRT may have a greater reach distance d1 than a conventional display apparatus without the grooves G and the protrusion PRT. When the reach distance d2 is large, a migration distance of the metal particles may increase, and thus a migration of the metal particles may be limited. Accordingly, the metal particles existing on the first wiring PL1 and the second wiring PL2 may be effectively prevented from forming dendrites. Accordingly, the short circuit occurring between the first wiring PL1 and the second wiring PL2 may be effectively prevented.

In such an embodiment, the reach distance d2 between the grooves G and the protrusion PRT may be increased without increasing the distance between the first wiring PL1 and the second wiring PL2, so the width of the bezel may be maintained narrow.

Each of the grooves G may mean or be defined by a portion in which the insulation interlayer 240 and the insulation layer 400 is removed. A lower surface of each of the grooves G may mean or be defined by a portion in which the insulation interlayer 240 and the insulation layer 400 are removed. However, in an alternative embodiment, each of the grooves G may mean or be defined by a portion in which a portion of the insulation interlayer 240 is removed. When the grooves G are formed through the insulation interlayer 240, the reach distance d2 may be the greatest.

The bottom surface of each of the grooves G may be disposed below a lower surface of the first wiring PL1 and a lower surface of the second wiring PL2. In such an embodiment, since the grooves G are portions in which the insulation interlayer 240 is removed, the lower surface of the grooves G may be disposed in a lower level than the lower surface of the first wiring PL1 and the lower surface of the second wiring PL2.

The protrusion PRT may include an insulation interlayer 240. IN such an embodiment, the protrusion PRT may mean or be defined by a portion disposed between the grooves G among the remaining portions of the passivation layer 100 after the grooves G are form by removing corresponding portions of the passivation layer 100. Since the protrusion PRT includes the insulation interlayer 240, the protrusion PRT may include an inorganic material. Since the reach distance d2 increases due to the protrusion PRT, the short circuit between the first wiring PL1 and the second wiring PL2 may be effectively prevented.

FIGS. 9 to 14 are cross-sectional views illustrating a method of manufacturing a display apparatus according to an embodiment of the display apparatus. Particularly, FIGS. 9 to 14 may illustrate an embodiment of a method of manufacturing the display apparatus 10 described with reference to FIGS. 1 to 8.

Figure 9:
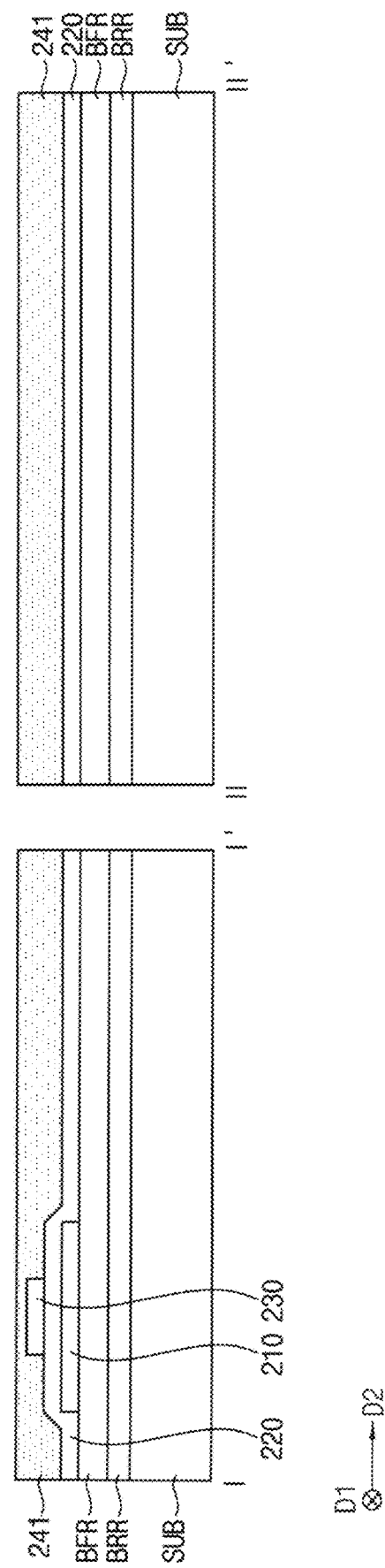
FIGS. 9 to 14 are cross-sectional views illustrating a method of manufacturing a display apparatus according to an embodiment of the display apparatus.

Referring to FIGS. 1 and 9, in an embodiment of a method of manufacturing a display apparatus, a substrate SUB, a barrier layer BRR, a buffer layer BFR, a semiconductor layer 210, a gate insulation layer 220, a gate electrode 230, and a preliminary insulation interlayer 241 may be provided. The substrate SUB, the barrier layer BRR, the buffer layer BFR, the gate insulation layer 220, and the preliminary insulation interlayer 241 may be sequentially stacked and formed in the display area DA and the peripheral area PA. The semiconductor layer 210 and the gate electrode 230 may be provided or formed in the display area DA.

Figure 10:
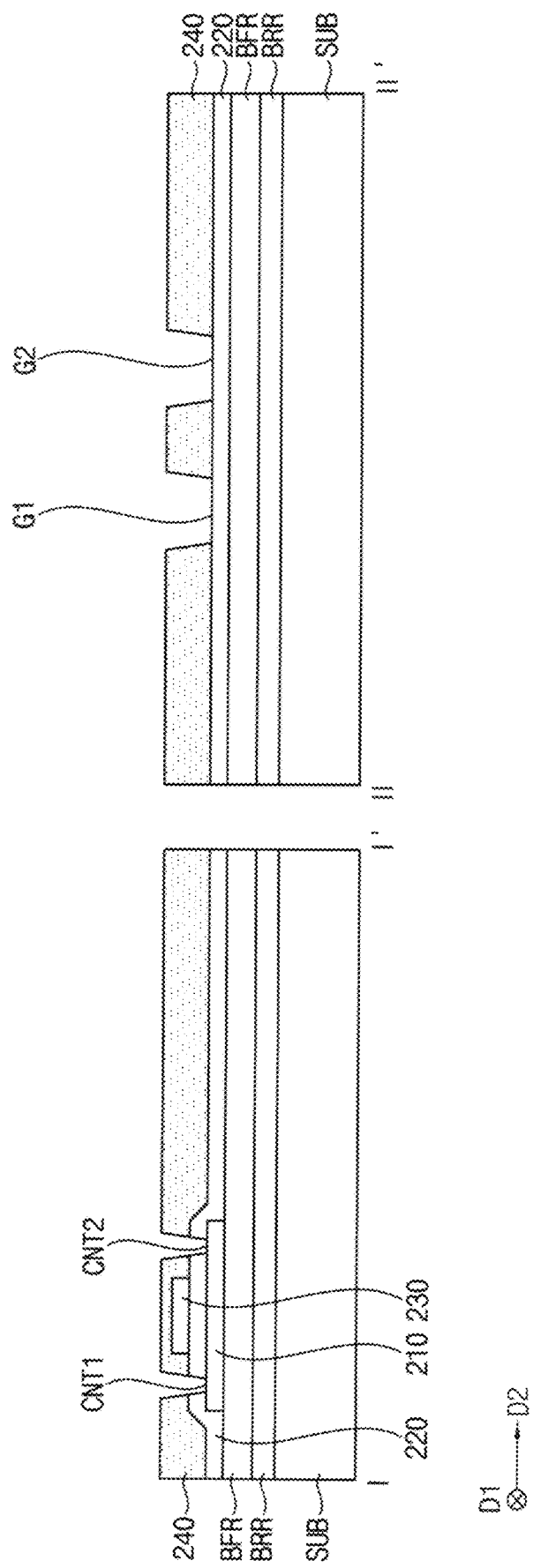

Referring to FIG. 10, photoresists may be provided or formed on the preliminary insulation interlayer 241. The preliminary insulation interlayer 241 may be patterned through an etch process. In such an embodiment, the preliminary insulation interlayer 241 that does not overlap the photoresists may be removed through the etch process. Accordingly, an insulation interlayer 240 in which a first contact hole CNT1, a second contact hole CNT2, a first groove G1, and a second groove G2 may be formed, may be provided or formed. In such an embodiment, since the first groove G1 and the second groove G2 are formed together with the first contact hole CNT1 and the second contact hole CNT2, an additional manufacturing process may not be used. Therefore, a manufacturing cost and a manufacturing time may be reduced.

Figure 11:
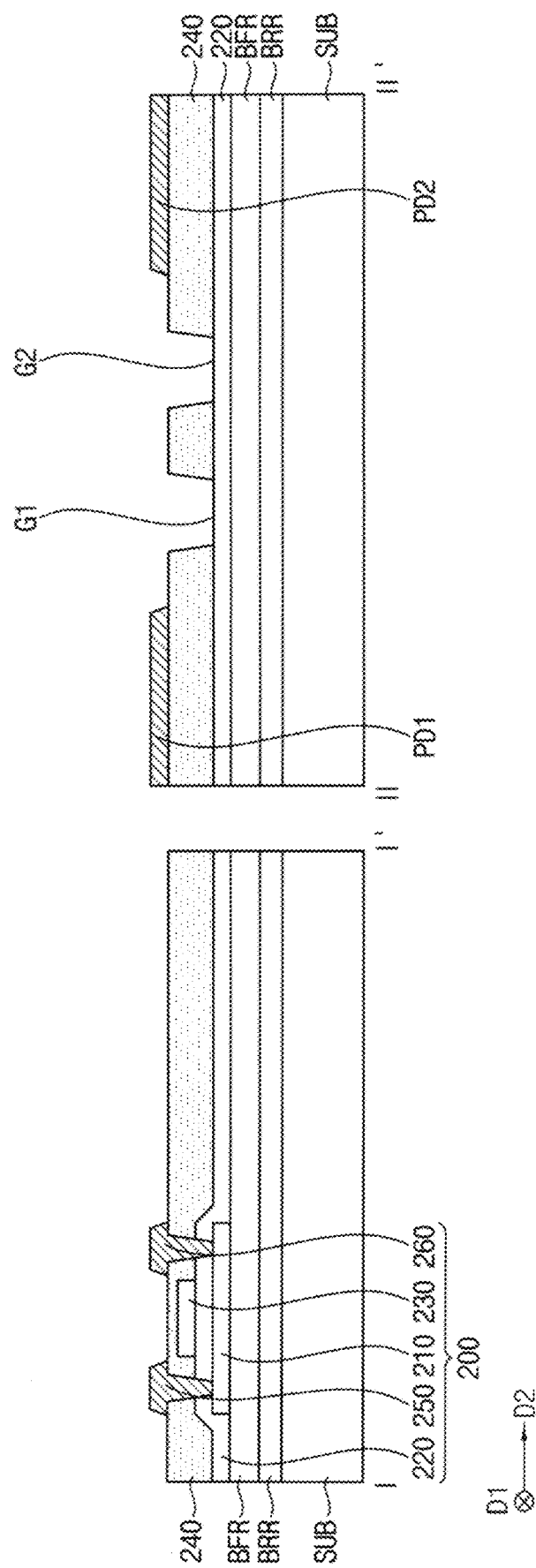

Referring to FIG. 11, a preliminary first conductive pattern may be provided or formed on the insulation interlayer 240. The preliminary first conductive pattern may entirely overlap the first contact hole CNT1, the second contact hole CNT2, the first groove G1, and the second groove G2. Photoresists may be provided or formed on the preliminary first conductive pattern. The photoresists may entirely overlap with the first and second contact holes CNT1 and CNT2, but may not overlap with the first and second grooves G1 and G2. The preliminary first conductive pattern may be patterned through an etch process. In such an embodiment, the preliminary first conductive pattern that does not overlap with the photoresists may be removed through the etch process. Accordingly, the source electrode 250, the drain electrode 260, the first pad PD1, and the second pad PD2 may be formed. Since the source electrode 250, the drain electrode 260, the first pad PD1 and the second pad PD2 are formed of or defined by the preliminary first conductive pattern, the source electrode 250, the drain electrode 260, the first pad PD1 and the second pad PD2 may include a same material as each other. The first pad PD1 and the second pad PD2 may be formed in a way such that the first groove G1 and the second groove G2 are disposed therebetween. That is, the first groove G1 and the second groove G2 may be disposed between the first pad PD1 and the second pad PD2.

Figure 12:
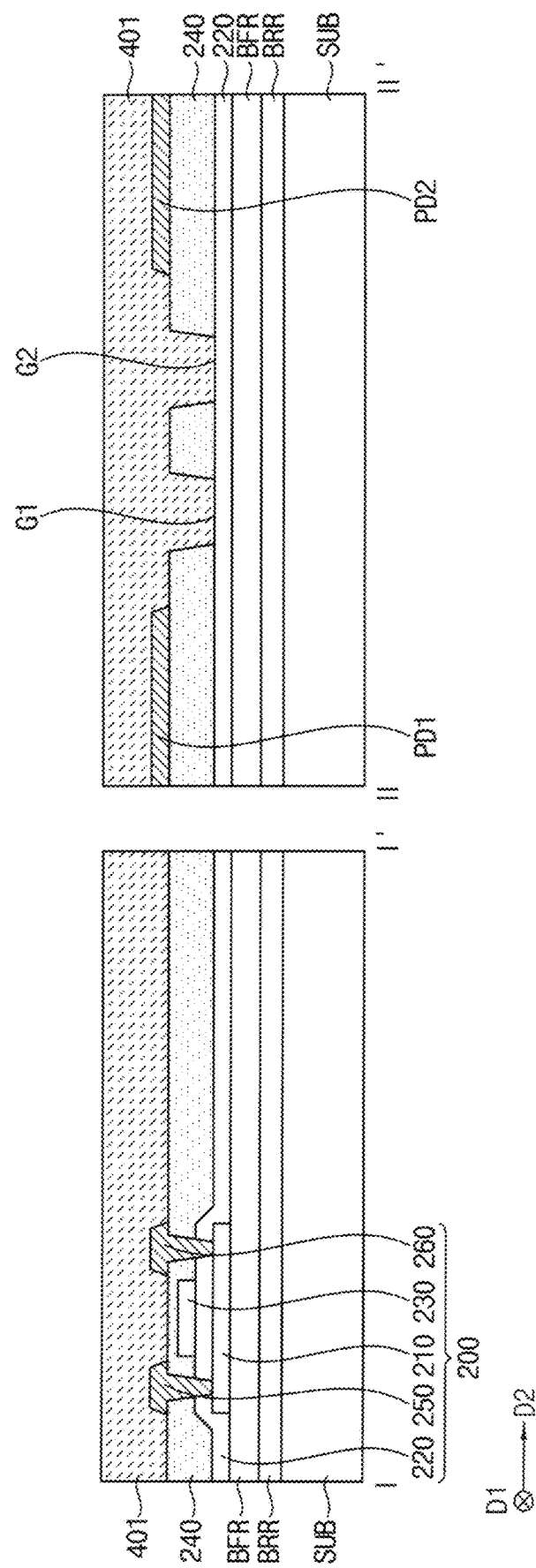
Figure 13:
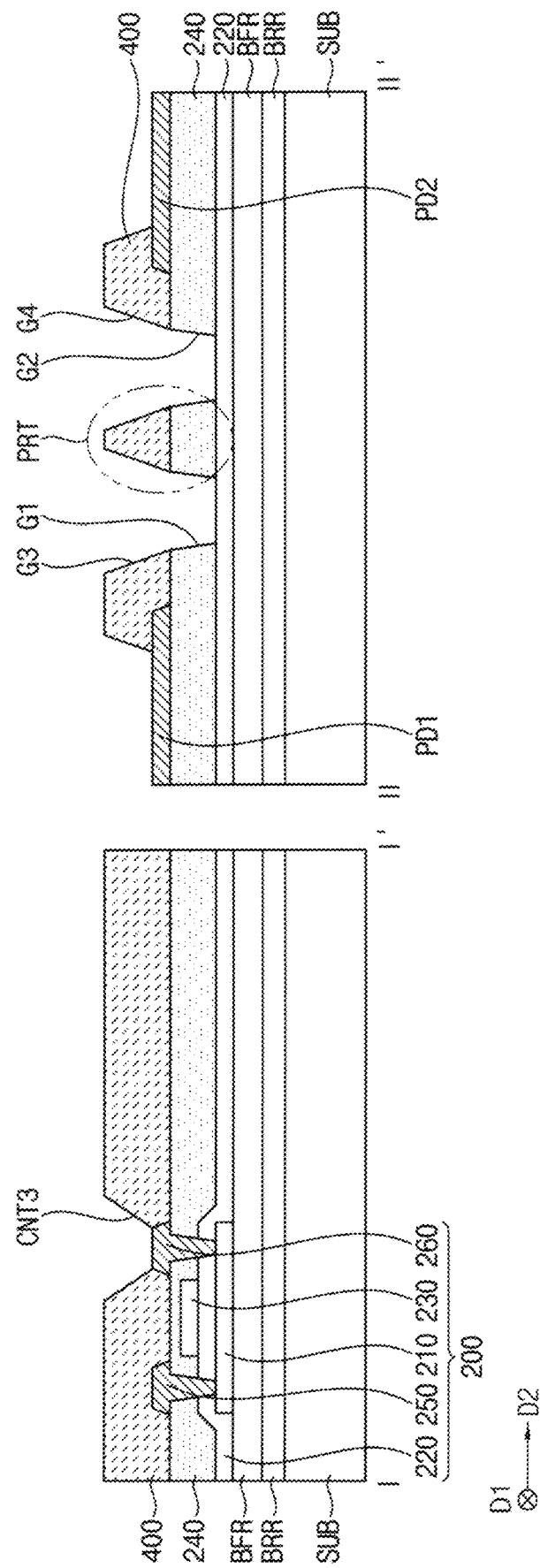

Referring to FIGS. 12 and 13, a preliminary insulation layer 401 may be provided or formed on the insulation interlayer 240. The preliminary insulation layer 401 may entirely overlap the source electrode 250, the drain electrode 260, the first groove G1 and the second groove G2. The preliminary insulation layer 401 that does not overlap the photoresists may be removed through an etch process. The photoresists may not overlap with the first groove G1 and the second groove G2. Accordingly, a third contact hole CNT3, a third groove G3, and a fourth groove G4 may be formed in the insulation layer 400.

The third contact hole CNT3 may overlap one of the source electrode 250 and the drain electrode 260. The third contact hole CNT3 may be a portion in which the insulation layer 400 is removed, and one of the source electrode 250 and the drain electrode 260 may be exposed through the third contact hole CNT3. The third groove G3 may overlap the first groove G1. The fourth groove G4 may overlap the second groove G2. Accordingly, one large groove may be formed by combining the first groove G1 and the third groove G3. In such an embodiment, another large groove may be formed by combining the fourth groove G4 and the second groove G2. Accordingly, a reach distance from the first pad PD1 to the second pad PD2 may be increased or maximized by the grooves. Accordingly, the short circuit between the first pad PD1 and the second pad PD2 may be prevented.

An edge of each of the first and second pads PD1 and PD2 may be formed to overlap the insulation layer 400. The edge of each of the first pad PD1 and the second pad PD2 overlap the insulation layer 400, so that the first pad PD1 and the second pad PD2 may be insulated from each other such that the short circuit between the first pad PD1 and the second pad PD2 may be effectively prevented.

Figure 14:
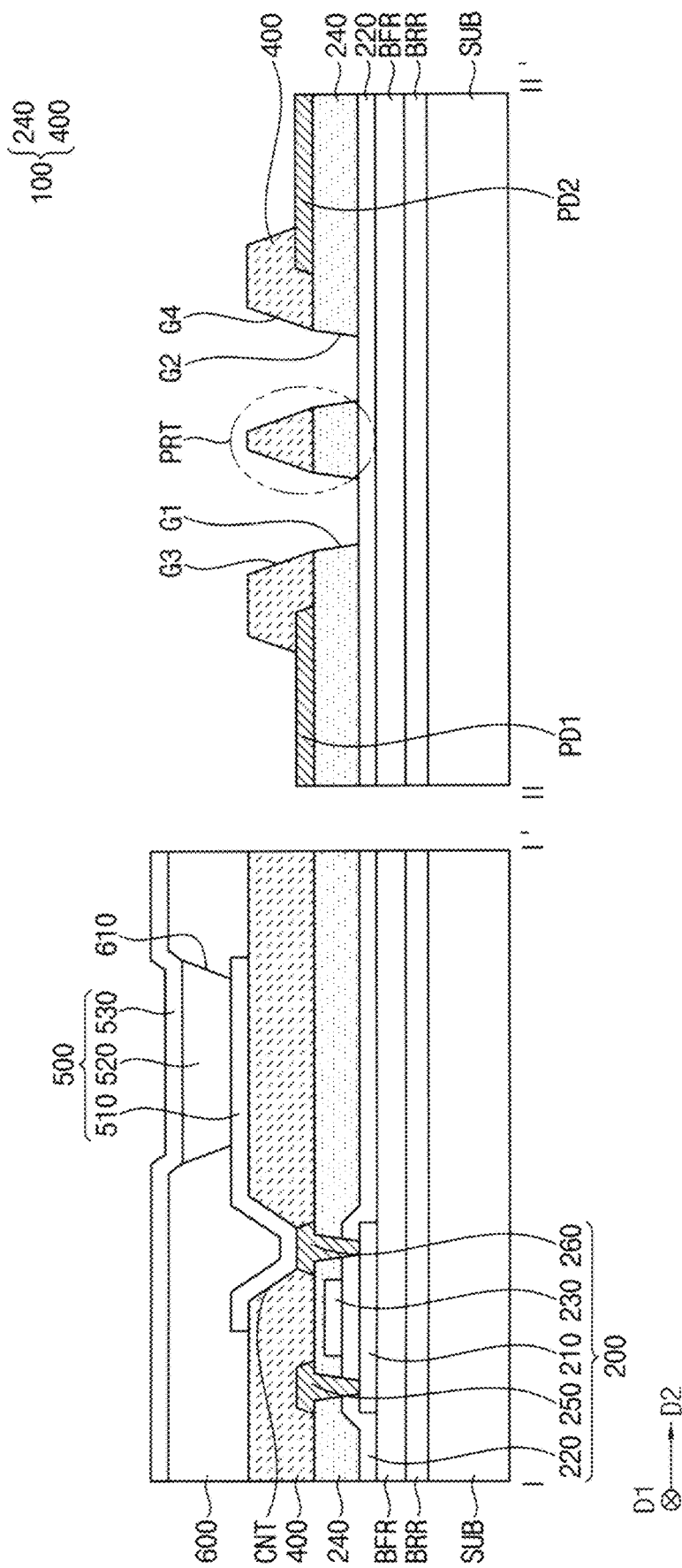

Referring to FIG. 14, a preliminary second conductive pattern may be provided or formed on the insulation layer 400. Photoresists may be formed on the preliminary second conductive pattern. The preliminary second conductive pattern may be patterned through an etch process. The preliminary second conductive pattern that does not overlap with the photoresists may be removed through the etch process. Accordingly, a pixel electrode 510 may be formed on the insulation layer 400. The pixel electrode 510 may include a reflective conductive material, a semi-transparent conductive material, or a transparent conductive material. In one embodiment, for example, the pixel electrode 510 may include at least one transparent conductive material such as ITO and IZO, and a metal such as lithium (Li), calcium (Ca), aluminum (Al), silver (Ag), magnesium (Mg) and gold (Au).

A pixel defining layer 600 may be provided or formed on the pixel electrode 510. An opening portion 610 may be formed through the pixel defining layer 600 to overlap the pixel electrode 510. The light emitting layer 520 may be provided or formed in the opening portion 610. A common electrode 530 for transmitting a common voltage may be disposed on the light emitting layer 520. The common electrode 530 may include a transparent conductive material such as ITO and IZO. The common electrode 530 may be formed to have a light transmittance by stacking metals such as calcium (Ca), barium (Ba), magnesium (Mg), aluminum (Al), and silver (Ag).

In an embodiment, when the preliminary second conductive pattern except the pixel electrode 510 is removed, metal particles such as silver may remain in the peripheral area PA. Accordingly, the metal particles may remain on the first pad PD1 and the second pad PD2 as well. The first pad PD1 and the second pad PD2 may apply different voltages from each other, and a voltage difference may generate between the first pad PD1 and the second pad PD2. In an embodiment, the reach distance between the first pad PD1 and the second pad PD2 may increase due to the first to fourth grooves G1, G2, G3, and G4. In such an embodiment, where the reach distance is large, a migration distance of the metal particles may increase, and thus a migration of the metal particles may be limited. Accordingly, the metal particles existing on the first pad PD1 and the second pad PD2 may be effectively prevented from forming dendrites. Accordingly, the short circuit between the first pad PD1 and the second pad PD2 may be prevented.

Embodiments of the display apparatus according to the invention may be applied to a display apparatus included in a computer, a notebook, a mobile phone, a smartphone, a smart pad, a personal media player ("PMP"), a personal digital assistant ("PDA"), an MP3 player, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate including a display area and a peripheral area disposed outside the display area;
a transistor disposed in the display area on the substrate;
a first pad part disposed in the peripheral area on the substrate;
a second pad part disposed in the peripheral area on the substrate and spaced apart from the first pad part;
a first pad disposed in the second pad part;
a second pad disposed in the second pad part and spaced apart from the first pad; and
a passivation layer including a plurality of grooves defined between the first pad and the second pad and a protrusion disposed between two adjacent grooves among the grooves.

2. The display apparatus of claim 1, wherein the passivation layer includes:

an insulation interlayer including an inorganic material; and
an insulation layer disposed on the insulation interlayer and including an organic material.

3. The display apparatus of claim 2, wherein an edge of each of the first pad and the second pad overlaps the insulation layer.

4. The display apparatus of claim 1, wherein the protrusion includes at least one selected from an organic material and an inorganic material.

5. The display apparatus of claim 1, wherein a lower surface of each of the grooves is disposed under a lower surface of the first pad and a lower surface of the second pad.

6. The display apparatus of claim 1, wherein a width of a lower surface of each of the grooves is in a range from about 3 micrometers to about 11.5 micrometers.

7. The display apparatus of claim 1, wherein an interval between the two adjacent grooves is in a range from about 3 micrometers to about 20 micrometers.

8. The display apparatus of claim 1, wherein the transistor includes:
a semiconductor layer including a channel region, a source region and a drain region;
a gate insulation layer disposed on the semiconductor layer;
a gate electrode disposed on the gate insulation layer;
an insulation interlayer disposed on the gate electrode;
a source electrode disposed on the insulation interlayer and connected to the source region; and
a drain electrode disposed on the insulation interlayer and connected to the drain region, and
wherein the first pad and the second pad are disposed on the insulation interlayer.

9. The display apparatus of claim 8, wherein the first pad and the second pad include a same material as the source electrode and the drain electrode.

10. The display apparatus of claim 1,
wherein the first pad part is connected to a driving chip, and
wherein the second pad part is connected to a flexible circuit board.

11. The display apparatus of claim 1, wherein the first pad and the second pad receive different voltages from each other.

12. A display apparatus comprising:
a substrate including a display area and a peripheral area disposed outside the display area;
a pad part disposed in the peripheral area on the substrate and including a first area including an organic material and a second area disposed outside the first area;
a wiring part overlapping the second area and including a first wiring and a second wiring; and
a passivation layer including a plurality of grooves defined between the first wiring and the second wiring and at a protrusion disposed between two adjacent grooves among the grooves.

13. The display apparatus of claim 12, wherein the passivation layer includes an insulation interlayer disposed under the first wiring and the second wiring.

14. The display apparatus of claim 12, wherein the protrusion includes an inorganic material.

15. The display apparatus of claim 12, wherein a lower surface of the groove is disposed under a lower surface of the first wiring and a lower surface of the second wiring.

16. A method of manufacturing a display apparatus, the method comprising:

providing an insulation interlayer on a substrate, wherein the insulation interlayer includes a first groove and a second groove;

providing a first pad and a second pad on the insulation interlayer with the first groove and the second groove disposed therebetween;

providing an insulation layer on the first pad and the second pad; and forming a third groove overlapping the first groove and a fourth groove overlapping the second groove in the insulation layer.

17. The method of claim 16, further comprising, providing a transistor on the substrate, wherein the transistor includes a semiconductor layer including a channel region, a source region and a drain region, a gate insulation layer formed on the semiconductor layer, a gate electrode formed on the gate insulation layer, an insulation interlayer formed on the gate electrode, wherein a first contact hole is formed through the insulation interlayer to overlap the source region and a second contact hole is formed through the insulation interlayer to overlap the drain region, a source electrode formed on the insulation interlayer and connected to the source region, and a drain electrode formed on the insulation interlayer and connected to the drain region, wherein the source electrode, the drain electrode, the first pad and the second pad are simultaneously formed with each other.

18. The method of claim 17, wherein a third contact hole is formed through the insulation layer further to overlap the source electrode or the drain electrode, wherein the first contact hole, the second contact hole, the first groove and the second groove are simultaneously formed with each other, and wherein the third contact hole, the third groove and the fourth groove are simultaneously formed with each other.

19. The method of claim 17, wherein the first pad and the second pad include a same material as the source electrode and the drain electrode.

20. The method of claim 16, wherein an edge of each of the first pad and the second pad overlaps the insulation layer.

* * * * *